United States Patent
Huang et al.

(10) Patent No.: US 10,749,021 B2
(45) Date of Patent: Aug. 18, 2020

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Sen Huang, Beijing (CN); Xinyu Liu, Beijing (CN); Xinhua Wang, Beijing (CN); Ke Wei, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/333,674

(22) Filed: Oct. 25, 2016

(65) Prior Publication Data

US 2017/0125571 A1 May 4, 2017

(30) Foreign Application Priority Data

Oct. 28, 2015 (CN) .......................... 2015 1 0712242

(51) Int. Cl.
*H01L 29/778* (2006.01)
*H01L 21/02* (2006.01)
(Continued)

(52) U.S. Cl.
CPC ...... *H01L 29/7787* (2013.01); *H01L 21/0217* (2013.01); *H01L 21/0228* (2013.01);
(Continued)

(58) Field of Classification Search
CPC ........... H01L 29/7787; H01L 29/66462; H01L 29/2003; H01L 21/02274; H01L 21/02636;
(Continued)

(56) References Cited

U.S. PATENT DOCUMENTS 8,937,336 B2 * 1/2015 Chen ................. H01L 21/02381
257/189
9,236,465 B2 * 1/2016 Liu .................... H01L 29/66431
(Continued)

FOREIGN PATENT DOCUMENTS

CN 101465372 A 6/2009
CN 104009074 A 8/2014

OTHER PUBLICATIONS

Huang, Mechanism of PEALD-Grown AlN Passivation for AlGaN/GaN HEMTs: Compensation of Interface Traps by Polarization Charges, IEEE Electron Device Letters, vol. 34, No. 2, Feb. 2013 pp. 193-195.*

(Continued)

*Primary Examiner* — Latanya N Crawford Eason
(74) *Attorney, Agent, or Firm* — Christensen, Fonder, Dardi & Herbert PLLC

(57) ABSTRACT

A GaN-based enhancement-mode power electronic device and a method for manufacturing the same. The GaN-based enhancement-mode power electronic device comprises: a substrate; a thin barrier Al(In,Ga)N/GaN heterostructure formed on the substrate; a gate, a source, and a drain formed on the thin barrier Al(In,Ga)N/GaN heterostructure. An AlN or SiNx passivation layer is formed on access regions between the gate and the source and between the gate and the drain, respectively, such that two dimensional electron gas is recovered in channels of the thin barrier Al(In,Ga)N/GaN heterostructure below the MN passivation layer by utilizing the MN passivation layer having polarization characteristics, or by using the SiNx passivation layer with positive fixed bulk/interface charges, so as to reduce on-resistance of the device and inhibit high-voltage current collapse in the device.

5 Claims, 2 Drawing Sheets

(51) Int. Cl.
  *H01L 23/29* (2006.01)
  *H01L 23/31* (2006.01)
  *H01L 29/20* (2006.01)
  *H01L 29/47* (2006.01)
  *H01L 29/66* (2006.01)

(52) U.S. Cl.
  CPC ...... *H01L 21/0254* (2013.01); *H01L 21/0262* (2013.01); *H01L 21/02274* (2013.01); *H01L 21/02636* (2013.01); *H01L 23/291* (2013.01); *H01L 23/3171* (2013.01); *H01L 29/2003* (2013.01); *H01L 29/475* (2013.01); *H01L 29/66462* (2013.01); *H01L 29/7786* (2013.01)

(58) Field of Classification Search
  CPC ............... H01L 21/0228; H01L 29/475; H01L 21/0254; H01L 21/0262; H01L 21/0217; H01L 29/7786; H01L 23/3171
  See application file for complete search history.

(56) References Cited

U.S. PATENT DOCUMENTS

| | | | |
|---|---|---|---|
| 10,381,472 B2* | 8/2019 | Nakayama | H01L 29/41766 |
| 2008/0017936 A1* | 1/2008 | Buchanan | H01L 21/823857 257/411 |
| 2010/0255646 A1 | 10/2010 | Suh et al. | |
| 2010/0258843 A1* | 10/2010 | Lidow | H01L 29/1066 257/192 |
| 2012/0028398 A1* | 2/2012 | Hawang | H01J 37/32082 438/72 |
| 2013/0153963 A1* | 6/2013 | Shealy | H01L 23/291 257/190 |
| 2013/0306978 A1* | 11/2013 | Chen | H01L 21/02381 257/76 |
| 2014/0001478 A1* | 1/2014 | Saunier | H01L 29/66462 257/76 |
| 2014/0103357 A1* | 4/2014 | Decoutere | H01L 29/7787 257/76 |
| 2014/0264360 A1* | 9/2014 | Huang | H01L 29/402 257/76 |
| 2014/0335666 A1* | 11/2014 | Koehler | H01L 29/66462 438/172 |
| 2014/0346530 A1 | 11/2014 | Nakata et al. | |
| 2015/0311084 A1* | 10/2015 | Moore | H01L 21/28587 257/280 |
| 2016/0284828 A1* | 9/2016 | Shimizu | H01L 29/7786 |

OTHER PUBLICATIONS

Third Office Action of Application No. 201510712242.8 dated Jul. 4, 2018, 17 pages.

* cited by examiner

SEMICONDUCTOR DEVICE AND METHOD FOR MANUFACTURING THE SAME

CROSS-REFERENCE TO RELATED APPLICATION(S)

This application is claims priority to Chinese Application No. 201510712242.8, filed on Oct. 28, 2015 and entitled "SEMICONDUCTOR DEVICE AND METHOD FOR MANUFACTURING THE SAME, which is incorporated herein by reference in their entirety.

FIELD OF THE INVENTION

The present disclosure relates to the semiconductor field, and particularly, The present disclosure relates to a field of GaN-based power electronics and microwave power amplifier technologies, and particularly to a GaN-based enhancement-mode power electronic device and method for manufacturing the same.

BACKGROUND

High efficient power electronic devices (also referred to as power switch devices) are of significant application value in domains such as smart grids, industrial controlling, new energy power generation, electric vehicles, and consumer electronics, etc. Globally, more than 70% of power electronic systems are manipulated and administrated by power administration systems based on power semiconductor devices. Performance of conventional Si power electronic devices approaches to the physical limit of Si semiconductor materials. Novel type of wide forbidden-band semiconductor devices, such as SiC and GaN, have higher breakdown electric field value, higher operation frequency and even lower on-resistance, and thus have already become promising candidates for the next generation of high efficient power electronics.

Enhancement-mode is essential for safe operation of power electronic devices, which ensures safety of the devices even without gate control when it is operated under high voltage, and will not cause damages of the system. For this reason, the power electronic devices have to be enhancement-mode (also referred to as normally-off) devices, that is, thresholds for the devices must be above 0V. Currently, GaN-based enhancement-mode power electronic devices are mainly manufactured on the basis of Al(In,Ga)N/GaN heterogeneous structures, in which, relying on strong spontaneous piezoelectric polarization effect between Al(In,Ga)N barrier layers and GaN buffer layers, a two-dimensional electron gas (2 DEG) with a density of up to $10^{13}$ cm$^{-2}$ will be induced in channels of Al(In,Ga)N/GaN heterostructures. Therefore, GaN-based power electronic devices which are manufactured based on such structures (including HEMTs and MIS-HEMTs) are generally depletion-type. Several kinds of techniques are world-widely used to realize GaN-based enhancement-mode devices, mainly comprising: 1) thinning the Al(In,Ga)N barrier layer by gate trench etching; 2) injecting negative fluoride ions into the Al(In,Ga)N barrier layer; 3) growing a P—(Al)GaN cap layer on surface of the barrier layer; 4) growing a InGaN or thick GaN anti-polarization layer on surface of the barrier layer; 5) a cascode configuration of enhancement-mode Si-MOSFET and GaN-based depleted HEMT/MIS-HEMT.

Gate trench etching is achieved by etching Al(In,Ga)N barrier layer with a plasma dry etching process. Since thickness of the barrier layer is typically about 20 nm, uniformity of etching depth among different wafers, especially those from different batches, are difficult to be maintained using such a technique, and industrialization of this technique is restrained. The fluoride ion injecting technique meets similar issues. The P—(Al)GaN cap layer technique and thick GaN anti-polarization layer technique implements the enhancement-mode by controlling thickness and doping of Metal Organic Chemical Vapor Deposition (MOCVD) or molecular beam epitaxy (MBE) growth, which in general may obtain a fine threshold uniformity and has been reported an exemplary product for P—(Al)GaN technique. The cascode technique uses well-developed Si-MOSFET (already industrialized) to implement the enhancement-mode, and exemplary power electronic products of 600V have been proposed.

In addition, because of the presence of the surface state, GaN-based power electronic device may exhibit serious current collapse phenomenon when it is operated at high voltage, which directly leads to increase of dynamic on-resistance and power consumption of the device. Researchers from Hong Kong University of Science and Technology use Plasma Enhancement-mode Atom Layer Deposition (PEALD) technique to epitaxial grow an AlN film with polarization characteristics on an III-nitride semiconductor. In this research, polarization-induced high density polarized charges are used to compensate for the surface state, such that the current collapse phenomenon at high voltage may be inhibited for GaN-based power electronic devices. Similarly, researchers from Institute of Microelectronics of Chinese Academy of Sciences also found that high density of positive fixed charges can also be induced by a SiNx passivation layer on the surface of GaN-based heterostructures, and effective suppression of current collapse in GaN power devices can also be achieved with SiNx grown by low-pressure chemical vapor deposition (LPCVD). Therefore, by utilizing the polarization characteristics of polarized AlN film or SiNx layer with positive fixed charges, besides inhibiting current collapse, 2 DEG of high density may also be achieved in thin barrier Al(In,Ga)N/GaN heterostructure.

In conclusion, combination of good enhancement-mode threshold control of the thin barrier Al(In,Ga)N/GaN heterostructure and high-density positive charges in polarized-AlN or SiNx passivation film helps to manufacture GaN-based power electronic devices with fine enhancement-mode threshold uniformity and low dynamic on-resistance, so that process repeatability and production yield of the GaN-based enhancement-mode device may be effectively improved, and industrialization of the GaN-based electronic devices are further pushed forward.

SUMMARY

Problems to be Solved

The present disclosure provides a GaN-based enhancement-mode power electronic device and a method for manufacturing the same, in order to improve process repeatability and production yield of the GaN-based enhancement-mode device, and thus facilitate industrialization of the GaN-based electronic devices.

Technical Solution

In order to achieve the above objects, the present disclosure provides a GaN-based enhancement-mode power electronic device comprising: a substrate; a thin barrier Al(In, Ga)N/GaN heterostructure formed on the substrate; a gate, a source, and a drain formed on the thin barrier Al(In,Ga)N/GaN heterostructure; wherein an AlN passivation layer or SiNx passivation layer is formed on access regions between the gate and the source and between the gate and the drain, respectively, such that two dimensional electron gas is recovered in channels of the thin barrier Al(In,Ga)N/GaN heterostructure below the passivation layer by utilizing the AlN passivation layer having polarization characteristics or SiNx passivation layer having high-density of positive fixed bulk/interface charges, so as to reduce on-resistance of the device and inhibit high-voltage current collapse in the device.

In the above solution, the thin barrier Al(In,Ga)N/GaN heterostructure is formed by successively epitaxial growing a GaN buffer layer and a Al(In, Ga)N barrier layer directly on the substrate by using Metal Organic Chemical Vapor Deposition (MOCVD) or molecular beam epitaxy (MBE) to implement an enhancement-mode gate structure.

In the above solution, in the thin barrier Al(In,Ga)N/GaN heterostructure, the Al(In,Ga)N barrier layer is an AlGaN or AlInN ternary alloy barrier layer or an AlInGaN quaternary alloy barrier layer, with a thickness below 10 nm. The enhancement-mode gate structure is a Schottky-type gate contact or a MIS-type gate contact, with a gate length in a range from 100 nm to 3 μm, wherein gate lines thinner than 1 μm are formed by using step-wise lithography or electron beam lithography, and gate lines thicker than 1 μm are formed by using optical lithography.

In the above solution, the AlN passivation layer is a passivation film with polarization characteristics, thickness of which is below 10 nm, wherein the AlN passivation layer is grown by using Plasma Enhancement-mode Atom Layer Deposition (PEALD) or Molecular Beam Epitaxy (MBE) at a low temperature from 150° C. to 500° C.

In the above solution, the SiNx passivation layer is a passivation film with high-density of positive fixed interface/bulk charges, thickness of which ranges between 10 and 120 nm, wherein the SiNx passivation layer is grown by using Low-Pressure Chemical Vapor Deposition (LPCVD) at above 600° C. or Inductively-Coupled Plasma Chemical Vapor Deposition (ICP-CVD) at a low temperature from 20° C. to 500° C.

In the above solution, the substrate is a Si substrate, a SiC substrate, a sapphire substrate or a homogeneous epitaxial GaN substrate.

In order to achieve the above objects, the present disclosure provides a method for manufacturing a GaN-based enhancement-mode power electronic device. The method comprises: forming a thin barrier Al(In,Ga)N/GaN heterostructure on a substrate; and forming a gate, a source, a drain, an AlN passivation layer or a $SiN_x$ passivation layer on the thin barrier Al(In,Ga)N/GaN heterostructure by using a gate-first or gate-last process.

In the above solution, the thin barrier Al(In,Ga)N/GaN heterostructure is formed by successively growing a GaN layer and a thin barrier layer directly on the substrate by using Metal Organic Chemical Vapor Deposition (MOCVD) or molecular beam epitaxy (MBE); in the gate-first process, the gate, the source and the drain are manufactured on the thin barrier Al(In,Ga)N/GaN heterostructure, and then the AlN passivation layer are formed on access regions between the gate and the source and between the gate and the drain, respectively; in the gate-last process, the AlN passivation layer or the $SiN_x$ passivation layer are successively manufactured on the thin barrier Al(In,Ga)N/GaN heterostructure, and then a gate opening is manufactured to form a Schottky-type gate contact or a MIS-type gate contact.

Beneficial Effects

The present disclosure has the following technical effects based on the above technical solutions.

1. The GaN-based enhancement-mode power electronic device and the method for manufacturing the same provide a technique for precisely adjusting threshold voltage for the GaN-based enhancement-mode power electronic device from a perspective of material growth. By adjusting growing conditions for Al(In,Ga)N barrier layer, controllability and uniformity of the threshold voltage for the GaN-based enhancement-mode power electronic device may be effectively improved, process repeatability and production yield of the GaN-based enhancement-mode device may be raised, and industrialization of the GaN-based electronic devices are further pushed forward.

2. In the thin barrier Al(In,Ga)N/GaN heterostructure adopted by the above solutions, the barrier layer has a thickness less than 10 nm, which may effectively lower an alloy temperature of source-drain ohm contact (below 850° C.).

3. Polarized charges in an AlN film with polarization characteristics (charge-polarized), or positive fixed bulk/interface charges in an SiNx layer are used to improve the 2DEG density of Al(In,Ga)N/GaN heterostructure channels, in order to compensate for increase of channel resistance in the gate-source and gate-drain regions due to Al(In,Ga)N/GaN thin barrier, therefore, on-resistance of the whole device may be effectively reduced.

4. The adopted AlN passivation film with polarization characteristics or SiNx passivation film with positive fixed charges can reduce channel resistance of the GaN-based power electronic devices (including HEMTs and MIS-HEMTs), and effectively passivate surface states of Al(In,Ga)N/GaN heterostructures, thus significantly inhibit high-voltage current collapse in the prepared power electronic devices.

DETAILED DESCRIPTION

In order to clarify the targets, solutions and advantages of the present disclosure, embodiments of the present disclosure will be further explained in detail hereafter with reference to the drawings.

Figure 1:
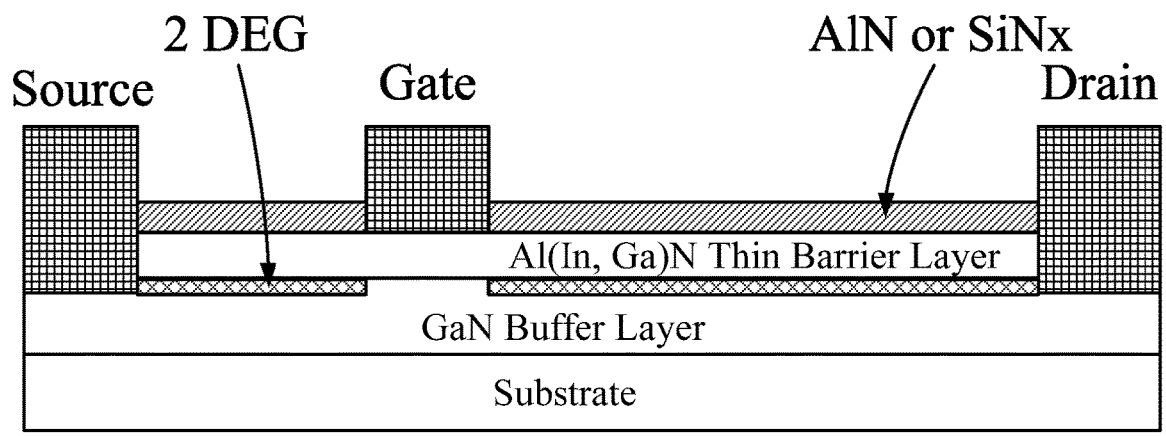
FIG. 1 is a schematic structural diagram of a GaN-based enhancement-mode power electronic device according to the present disclosure.

As shown in FIG. 1, the GaN-based enhancement-mode power electronic device comprises: a substrate; a thin barrier Al(In,Ga)N/GaN heterostructure formed on the substrate; a gate, a source, and a drain formed on the thin barrier Al(In,Ga)N/GaN heterostructure. An AlN or SiNx passivation layer is formed on access regions between the gate and the source and between the gate and the drain, respectively, such that two dimensional electron gas is recovered in channels of the thin barrier Al(In,Ga)N/GaN heterostructure below the passivation layer by utilizing the AlN passivation layer having polarization characteristics, or by utilizing the SiNx passivation layer having positive fixed bulk/interface charges, so as to reduce on-resistance of the device and inhibit high-voltage current collapse in the device.

In FIG. 1, the thin barrier Al(In,Ga)N/GaN heterostructure is formed by successively epitaxial growing a GaN buffer layer and a Al(In, Ga)N barrier layer directly on the substrate by using MOCVD or MBE to implement an enhancement-mode gate structure. In the thin barrier Al(In, Ga)N/GaN heterostructure, the Al(In,Ga)N barrier layer is an AlGaN or AlInN ternary alloy barrier layer or an AlInGaN quaternary alloy barrier layer, with a thickness below 10 nm. The substrate is a Si substrate, a SiC substrate, a sapphire substrate or a homogeneous epitaxial GaN substrate.

The GaN-based enhancement-mode power electronic device provided in the present disclosure is formed by epitaxial growing the thin barrier Al(In,Ga)N/GaN heterostructure directly on the substrate by MOCVD or MBE to implement the enhancement-mode gate structure. In the access regions between the gate and the source and between the gate and the drain, the AlN passivation layer with polarization characteristics or the SiNx passivation layer with positive fixed bulk/interface charges is used to recover the 2 DEG in channels below the passivation layer, so as to reduce on-resistance of the device. The AlN or SiNx passivation layer can also effectively inhibit high-voltage current collapse in the GaN-based enhancement-mode power electronic device. The AlN passivation layer is a passivation film with polarization characteristics, thickness of which is less than 10 nm, wherein the AlN passivation layer is grown by using PEALD or MBE at a low temperature from 150° C. to 500° C. The SiNx passivation layer is a passivation film with high-density of positive fixed interface/bulk charges, thickness of which ranges between 10 and 120 nm, wherein the SiNx passivation layer is grown by using Low-Pressure Chemical Vapor Deposition (LPCVD) at above 600° C. or Inductively-Coupled Plasma Chemical Vapor Deposition (ICP-CVD) at a low temperature from 20° C. to 500° C.

Figure 2:
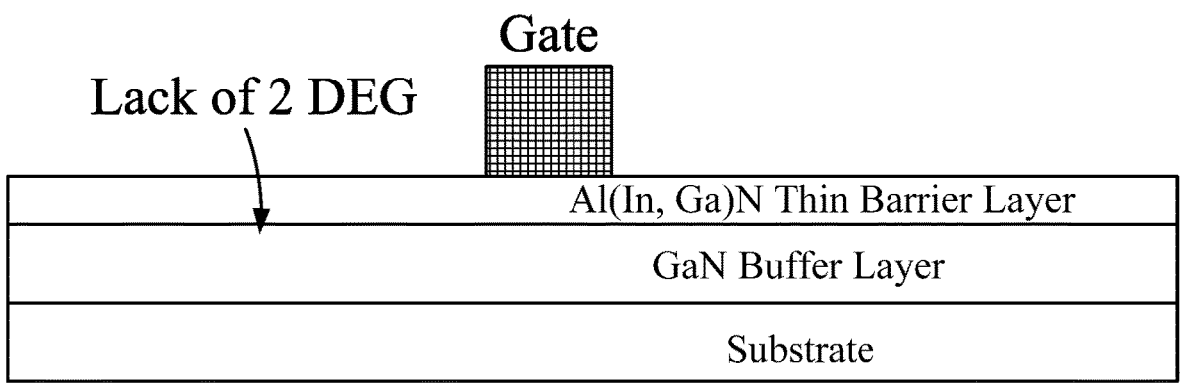
FIG. 2 is a schematic diagram of a thin barrier Al(In,Ga)N/GaN heterostructure for realizing GaN-based enhancement-mode power device.

FIG. 2 shows a schematic diagram of a thin barrier Al(In,Ga)N/GaN heterostructure for realizing GaN-based enhancement-mode. By controlling the thickness of the Al(In,Ga)N barrier (less than 10 nm) in the MOCVD or MBE process, the spontaneous piezoelectric polarization in the barrier layer will be reduced, and thus the 2 DEG density in channels of the heterostructure (including 2 DEG in the region below the gate) will be reduced, so as to achieve enhancement-mode threshold.

Figure 3:
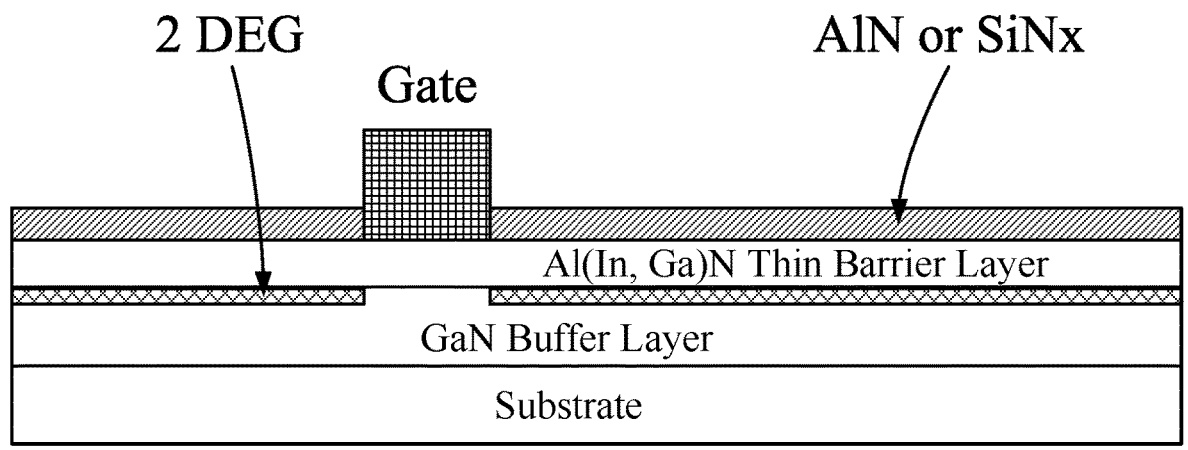
FIG. 3 is a schematic diagram of achieving 2 DEG recovery in access regions between the gate and the source and between the gate and the drain of the GaN-based enhancement-mode power electronic device by using an AlN or SiNx passivation layer.

FIG. 3 illustrates using the AlN passivation layer with polarization characteristics or the SiNx passivation layer with positive fixed bulk/interface charges to recover 2 DEG in channels below the passivation layer while maintaining the 2 DEG in the gate region in a depletion state so as to implement the enhancement-mode device structure. The AlN or SiNx passivation layer also inhibits high-voltage current collapse in the GaN-based enhancement-mode power electronic device, and thus further improves high-voltage dynamic performance of the device.

In the method for manufacturing a GaN-based enhancement-mode power electronic device provided by the present disclosure, generally, a thin barrier Al(In,Ga)N/GaN heterostructure is formed on a substrate firstly, and then a gate, a source, a drain, an AlN or SiNx passivation layer is formed on the thin barrier Al(In,Ga)N/GaN heterostructure by using a gate-first or gate-last process. In the method, either the gate-first or the gate-last process will be valid, that is, the metal gate manufacturing process and the passivation process are interchangeable. Specifically, the AlN or SiN$_x$ passivation may be performed first, and then a gate opening is manufactured to form a Schottky-type or MIS-type gate contact. Alternatively, the gate may be manufactured first, and then AlN/SiN$_x$ passivation will be performed.

The thin barrier Al(In,Ga)N/GaN heterostructure is formed by successively epitaxial growing a GaN layer and a thin barrier layer directly on the substrate by using Metal Organic Chemical Vapor Deposition (MOCVD) or molecular beam epitaxy (MBE). In the gate-first process, the gate, the source and the drain are prepared on the thin barrier Al(In,Ga)N/GaN heterostructure, and then the AlN or SiNx passivation layer is formed on access regions between the gate and the source and between the gate and the drain, respectively. In the gate-last process, the AlN or SiNx passivation layer is manufactured on the thin barrier Al(In, Ga)N/GaN heterostructure, and then a gate opening is manufactured to form a Schottky-type gate contact or a MIS-type gate contact.

Although the above embodiments further illustrate targets, technical solutions, and beneficial effects of the present disclosure, it will be understood that, such embodiments are only exemplary rather than limitative. Those skilled in the art may carry out various replacements and modifications without departing the scope of the present disclosure. Such replacements and modifications are within the scope of the present disclosure.

We claim:

1. A GaN-based enhancement-mode power electronic device which is normally-off, comprising:
   a substrate;
   a buffer layer;
   a thin barrier Al(In,Ga)N/GaN heterostructure formed on the substrate, the thin barrier Al(In,Ga)N/GaN heterostructure including the buffer layer and an Al(In,Ga)N/GaN barrier layer, wherein the Al(In,Ga)N barrier layer is an AlGaN ternary alloy barrier layer with a thickness less than 10 nm or an AlInN ternary alloy barrier layer with a thickness less than 10 nm or an AlInGaN quaternary alloy barrier layer with a thickness of less than 10 nm; and
   a gate, a source, and a drain formed on the thin barrier Al(In,Ga)N/GaN heterostructure;
   wherein the buffer layer and the barrier layer both are a completely planar structural layer, and the thickness of the barrier layer below the gate region and in other regions are both less than 10 nm; and
   wherein a SiNx passivation layer is formed on access regions between the gate and the source and between the gate and the drain, respectively, such that two-dimensional electron gas is recovered in channels of the thin barrier Al(In,Ga)N/GaN heterostructure below the SiNx passivation layer by utilizing the SiNx passivation layer with a high-density of positive fixed bulk/interface charges, so as to reduce on-resistance of the device and inhibit high-voltage current collapse in the device, wherein the thickness of the SiNx passivation layer ranges between 10 and 120 nm, and the SiNx passivation layer is grown by using Low-Pressure Chemical Vapor Deposition (LPCVD) at above 600° C. or Inductively-Coupled Plasma Chemical Vapor Deposition (ICP-CVD) at a low temperature from 20° C. to 500° C.,
   wherein the SiNx passivation layer is only deposited on portions of an upper surface of the barrier layer that are between the gate and the source/the drain, in order to recover the two-dimensional electron gas in channels of the thin barrier Al(In,Ga)N/GaN heterostructure only below the SiNx passivation layer.

2. The GaN-based enhancement-mode power electronic device according to claim 1, wherein the thin barrier Al(In,Ga)N/GaN heterostructure is formed by successively epitaxially growing a GaN buffer layer and a Al(In,Ga)N barrier layer directly on the substrate by using Metal Organic Chemical Vapor Deposition (MOCVD) or molecular beam epitaxy (MBE) to implement an enhancement-mode gate structure.

3. The GaN-based enhancement-mode power electronic device according to claim 1, wherein the substrate is a Si substrate, a SiC substrate, a sapphire substrate or a homogeneous epitaxial GaN substrate.

4. A method for manufacturing a GaN-based enhancement-mode power electronic device, comprising:
    forming a thin barrier Al(In,Ga)N/GaN heterostructure on a substrate, the thin barrier Al(In,Ga)N/GaN heterostructure including a buffer layer and an Al(In,Ga)N/GaN barrier layer, wherein the Al(In,Ga)N barrier layer is an AlGaN ternary alloy barrier with a thickness less than 10 nm or an AlInN ternary alloy barrier layer with a thickness less than 10 nm or an AlInGaN quaternary alloy barrier layer with a thickness of less than 10 nm; and
    forming a gate, a source, a drain, a SiNx passivation layer on the thin barrier Al(In,Ga)N/GaN heterostructure by using a gate-first process or gate-last process, the SiNx passivation layer is formed on access regions between the gate and the source and between the gate and the drain, respectively, such that two-dimensional electron gas is recovered in channels of the thin barrier Al(In,Ga)N/GaN heterostructure below the SiNx passivation layer by utilizing the SiNx passivation layer with high-density of positive fixed bulk/interface charges, so as to reduce on-resistance of the device and inhibit high-voltage current collapse in the device, wherein the thickness of the SiNx passivation layer ranges between 10 and 120 nm, and the SiNx passivation layer is grown by using Low-Pressure Chemical Vapor Deposition (LPCVD) at above 600° C. or Inductively-Coupled Plasma Chemical Vapor Deposition (ICP-CVD) at a low temperature from 20° C. to 500° C.;
wherein the buffer layer and the barrier layer both are a completely planar structural layer, and the thickness of the barrier layer below the gate region and in other regions are both less than 10 nm, and
wherein the SiNx passivation layer is only deposited on portions of an upper surface of the barrier layer that are between the gate and the source/the drain, in order to recover the two-dimensional electron gas in channels of the thin barrier Al(In/Ga)N/GaN heterostructure only below the SiNx passivation layer.

5. The method according to claim 4, wherein
the thin barrier Al(In,Ga)N/GaN heterostructure is formed by successively epitaxial growing a GaN layer and a thin barrier layer directly on the substrate by using Metal Organic Chemical Vapor Deposition (MOCVD) or molecular beam epitaxy (MBE);
in the gate-first process, the gate, the source and the drain are manufactured on the thin barrier Al(In,Ga)N/GaN heterostructure, and then the SiNx passivation layer is formed on access regions between the gate and the source and between the gate and the drain, respectively;
in the gate-last process, the SiNx passivation layer is manufactured on the thin barrier Al(In,Ga)N/GaN heterostructure, and then a gate opening is manufactured to a Schottky-type gate contact or a MIS-type gate contact.

* * * * *